United States Patent [19]
Namiki et al.

[11] Patent Number: 5,429,884
[45] Date of Patent: Jul. 4, 1995

[54] ORGANIC ELECTROLUMINESCENT ELEMENT

[75] Inventors: Tohru Namiki; Hitoshi Sato; Kenichi Nagayama; Teruichi Watanabe; Masanao Shinkai, all of Tsurugashima, Japan

[73] Assignee: Pioneer Electronic Corporation, Tokyo, Japan

[21] Appl. No.: 961,506

[22] Filed: Oct. 15, 1992

[30] Foreign Application Priority Data

Jan. 17, 1992 [JP] Japan .................. 4-006823
Jan. 17, 1992 [JP] Japan .................. 4-006824

[51] Int. Cl.$^6$ ............................. H05B 33/26
[52] U.S. Cl. .................. 428/690; 428/691; 428/917; 313/503; 313/504; 313/509
[58] Field of Search ............ 428/690, 691, 917; 313/503, 504, 509

[56] References Cited

U.S. PATENT DOCUMENTS

| | | | |
|---|---|---|---|
| 4,356,429 | 10/1982 | Tang | 313/503 |
| 4,885,211 | 12/1989 | Tang et al. | 428/457 |
| 5,047,687 | 9/1991 | VanSlyke | 313/503 |
| 5,059,861 | 10/1991 | Littman et al. | 313/503 |
| 5,073,446 | 12/1991 | Scozzafava et al. | 428/323 |

*Primary Examiner*—Charles R. Nold
*Attorney, Agent, or Firm*—Fish & Richardson

[57] ABSTRACT

Disclosed are organic EL elements having high environmental stability as well as high luminous efficiency and luminance. In an organic EL element comprising a transparent anode, a hole-carrying layer, a light-emitting layer and an alloy cathode consisting of a first metal Li and a stabilizing second metal Al, all laminated on a substrate, the concentration of the first metal Li contained in the alloy region with a predetermined thickness from the interface between the alloy cathode and the organic layer is controlled to a minute amount ranging from 0.005 wt. % to 0.3 wt. %. In another organic EL element comprising a transparent anode, a hole-carrying layer, a light-emitting layer and an alloy cathode consisting of a first metal Sr and a stabilizing second metal Mg, all laminated on a substrate, the concentration of the first metal Sr contained in the alloy region with a predetermined thickness from the interface between the alloy cathode and the organic layer (light-emitting layer or electron-carrying layer) is controlled to a minute amount ranging from 10 wt. % to 40 wt. %.

24 Claims, 11 Drawing Sheets

EMISSION

EMISSION

ORGANIC ELECTROLUMINESCENT ELEMENT

BACKGROUND OF THE INVENTION

1. Field of the Invention

The present invention relates to an organic electroluminescent element (hereinafter called "organic EL element").

2. Description of the Related Art

There is an organic EL element with a double-layer structure, which has an organic fluorescent film 3 as a light-emitting layer and an organic hole-carrying layer 4, both formed of an organic compound and laminated one on the other between a metal electrode 1 as a cathode and a transparent electrode 2 as an anode. The organic hole-carrying layer 4 has a function to facilitate the injection of holes from the anode and a function to block electrons. A glass substrate 6 is arranged outside the transparent electrode 2. As electrons from the metal electrode 1 and the holes from the transparent electrode 2 are recombined, excitons are generated. The excitons emit light while they are deactivated, and this light is emitted outside through the transparent electrode 2 and the glass substrate 6.

It is desirable that the metal electrode 1 as the cathode in the conventional organic EL element be made of metal having a low work function equal to or below 3 electron volts (which will hereinafter be referred to as "low work function metal") due to its effectiveness in electron injection. Since the cathode of such low work function metal is disadvantageous in film formability, stability and the like, however, metals having a high work function above 3 electron volts (which will hereinafter be referred to as "high work function metal"), for example, aluminum or magnesium or magnesium indium alloy, magnesium aluminum alloy or magnesium silver alloy as a single material or a co-evaporated alloy are presently used (see U.S. patent application Ser. No. 135,128 filed Feb. 11, 1987, corresponding to Unexamined Japanese Patent Publication No. 63-295695).

An organic EL element having such a conventional alloy cathode does not, however, have sufficient environmental stability and film formability; for example, in an organic EL element having the cathode made of an aluminum magnesium alloy, particularly, a non-light-emitting portion (hereinafter referred to as "black spot") is generated in the light-emitting area (1 dot: 2 ×2 mm) and grows with time. The use of the conventional alloy cathode makes it difficult to increase the luminance with a low drive voltage, and cannot thus provide an organic EL element with high luminous efficiency and high luminance.

SUMMARY OF THE INVENTION

It is therefore an object of the present invention to provide an organic EL element, which has high environmental stability as well as high luminous efficiency and high luminance.

According to one aspect of the present invention, there is provided an organic EL element, which comprises an anode, a hole-carrying layer formed of an organic compound, a light-emitting layer formed of an organic compound and a cathode, laminated in order on a substrate, the cathode being made of a first metal as a low work function metal with a low work function equal to or below 3 electron volts and a second metal capable of stabilizing the first metal, and having an alloy region contacting an interface between the light-emitting layer and the cathode, the first metal being lithium, the second metal being aluminum, the alloy region containing the lithium with a concentration of 0.005 to 0.3 wt. %, preferably in a weight ratio of 0.01 part by weight to 0.1 part by weight inclusive, to 100 parts by weight of the aluminum.

According to another aspect of the present invention, there is provided an organic EL element, which comprises an anode, a hole-carrying layer formed of an organic compound, a light-emitting layer formed of an organic compound and a cathode, laminated in order on a substrate, the cathode being made of a first metal as a low work function metal with a low work function equal to or below 3 electron volts and a second metal capable of stabilizing the first metal, and having an alloy region contacting an interface between the light-emitting layer and the cathode, the first metal being strontium, the second metal being magnesium, the alloy region containing the strontium with a concentration of 10 to 40 wt. %, preferably in a weight ratio of 10 parts by weight to 25 parts by weight inclusive, to 100 parts by weight of the magnesium.

According to a further aspect of the present invention, there is provided an organic EL element, which comprises a transparent anode, a hole-carrying layer formed of an organic compound, a light-emitting layer formed of an organic compound and an alloy cathode, laminated in order on a substrate, and a protective electrode formed on the alloy cathode, the alloy cathode being made of a first metal as a low work function metal with a low work function equal to or below 3 electron volts and a second metal capable of stabilizing the first metal.

According to a different aspect of the present invention, there is provided an organic EL element, which comprises an anode, a hole-carrying layer formed of an organic compound, a light-emitting layer formed of an organic compound and a cathode, laminated in order on a substrate, the cathode being made of indium (In) and lithium (Li) and having an alloy region contacting an interface between the light-emitting layer and the cathode, the alloy region containing the lithium with a concentration of 0.005 to 0.11 wt. %, preferably in a weight ratio of 0.01 part by weight to 0.1 part by weight inclusive, to 100 parts by weight of the indium.

The present invention can provide organic EL elements having high environmental stability and high luminance and capable of being driven with a low voltage.

DETAILED DESCRIPTION OF THE PREFERRED EMBODIMENTS

Preferred embodiments of the present invention will now be described referring to the accompanying drawings.

Figure 2:
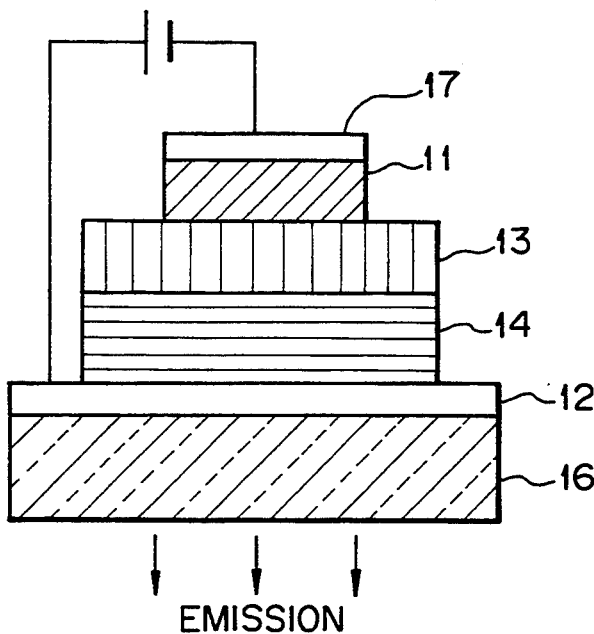
FIG. 2 is a diagram illustrating the structure of organic EL elements of Examples 1 and 2.

In an organic EL element embodying the present invention as shown in FIG. 2, a thin organic fluorescent film 13 as a light-emitting layer and an organic hole-carrying layer 14, both formed of an organic compound, are laminated one on the other between an alloy cathode 11 and a transparent electrode 12 as an anode. A glass substrate 16 is arranged outside the transparent electrode 12. It is preferable that a protective electrode 17 be made of aluminum (Al) or magnesium (Mg) regardless of the composition of the alloy cathode 11 in view of the work function, film formability, stability and cost. It is also preferable that a first metal of the alloy cathode 11 be an alkali metal or alkali earth metal, such as lithium (Li) or strontium (Sr), having a low work function. The presence of the protective electrode 17 can increase the composition ratio of the second metal which is a high work function metal in the alloy cathode 11. With the above structure, the second metal has an effect of reducing the sheet resistances of the whole cathode and protective electrode in addition to an effect of stabilizing the first metal.

It is preferable that the thickness of the alloy cathode 11 be a half to two-thirds of the entire thickness of the alloy cathode 11 and protective electrode 17, and that the protective electrode 17 be formed thin. It is preferable that the entire thickness of the alloy cathode 11 and protective electrode 17 be 1000 to 3000 angstroms (Å).

The alloy cathode 11 made by co-evaporation of the first and second metals contains the first metal component of 10 to 30 wt. % of the whole co-evaporated alloy, the remainder of 70 to 90 wt. % being the second metal. The first metal is a low work function metal, and the second metal is a high work function metal having higher film formability and stability.

Although it is preferable, as mentioned above, that the protective electrode 17 be formed of aluminum or magnesium, it is also preferable that aluminum or magnesium be selected as the second metal of the alloy cathode 11 so that the protective electrode may be a single layer acquired by evaporation of the second metal. This alternative allows the protective electrode 17 to be formed directly from the alloy cathode 11 using the same apparatus.

Specifically, as Examples 1 and 2, organic EL elements were produced by forming the alloy cathode and the protective electrode under the conditions given in Tables 1 and 2 below.

TABLE 1

|  |  | Evaporated Material | Evaporation Speed (Å/sec) | Thickness (Å) |
| --- | --- | --- | --- | --- |
| Alloy cathode | first metal | Li | 0.5 to 50 | 500 to 1000 |
|  | second metal | Al |  |  |
| Protective electrode | second metal | Al | 20 | 1000 to 1500 |

TABLE 2

|  |  | Evaporated Material | Evaporation Speed (Å/sec) | Thickness (Å) |
| --- | --- | --- | --- | --- |
| Alloy cathode | first metal | Sr | 0.5 to 50 | 500 to 800 |
|  | second metal | Al |  |  |
| Protective electrode | second metal | Al | 20 | 1000 to 3000 |

Figure 3:
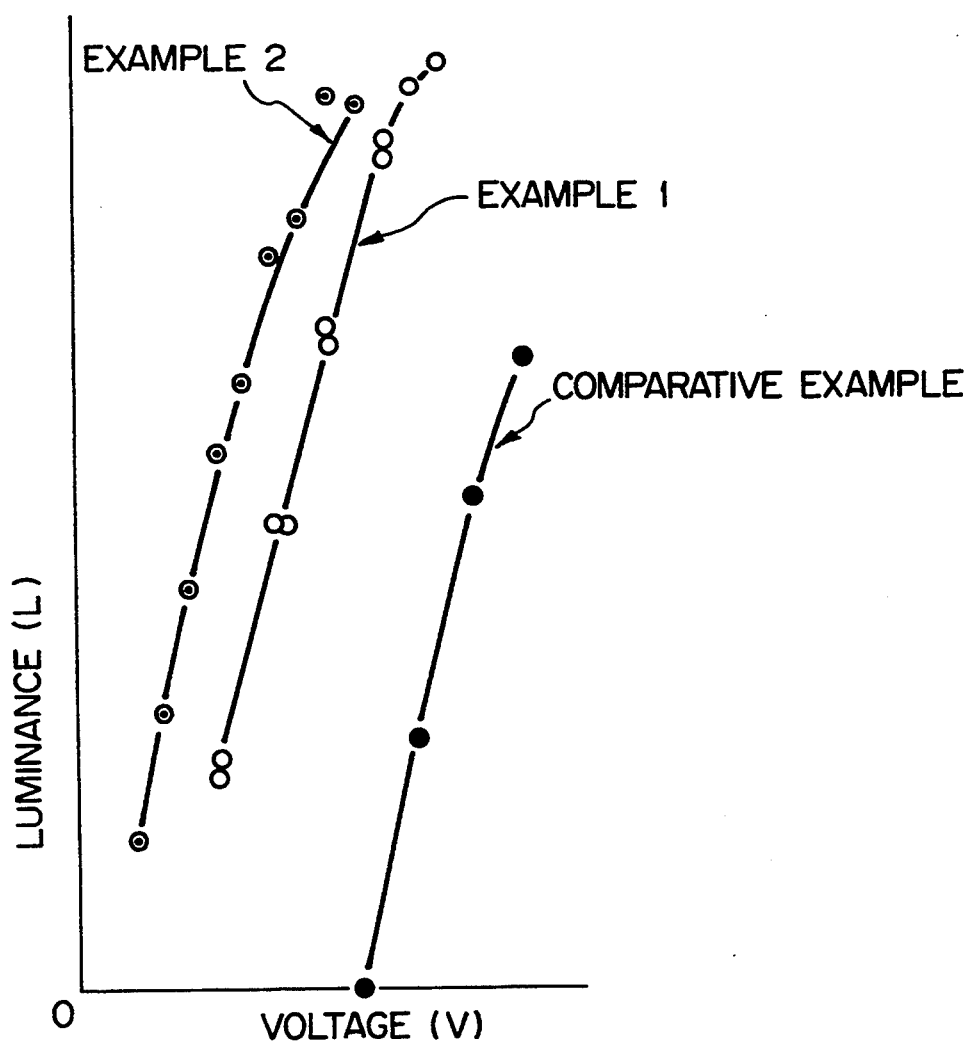
FIG. 3 presents a graph showing the luminance vs. drive voltage characteristics of organic EL elements of Examples 1 and 2 and a comparative example.

FIG. 3 presents a graph showing the luminance vs. drive voltage characteristics of the organic EL elements produced. In the graph, the luminance of the element of Example 1 having a lithium aluminum alloy cathode and an aluminum protective electrode is indicated by "0", the luminance of the element of Example 2 having a strontium aluminum alloy cathode and an aluminum protective electrode is indicated by "0", and the luminance of an organic EL element produced as a comparative example, which only has a cathode made of aluminum alone is indicated by ●.

Figure 4:
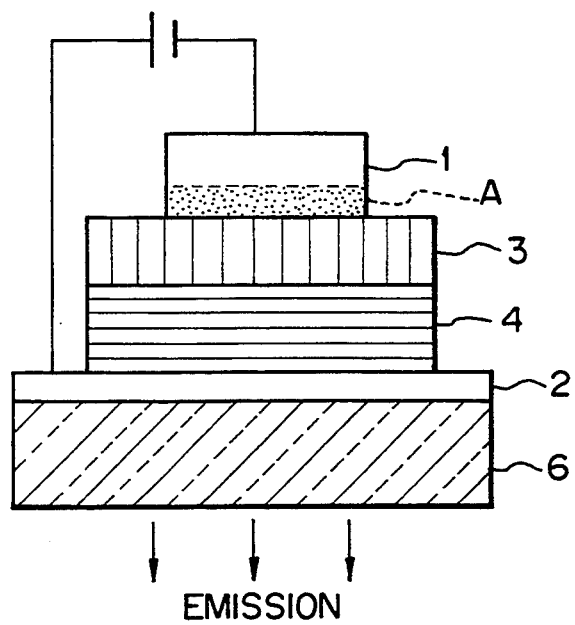
FIG. 4 is a diagram illustrating the structure of organic EL elements of Examples 3 and 4.

As apparent from FIG. 4, the organic EL elements of these Examples have high luminance with a low drive voltage. That is, both Examples provided a lower drive voltage. Further, other experiments showed that the voltage increase rate during emission of the elements as well as the attenuation rate of luminance dropped.

Even with the presence of lithium or strontium in the alloy cathode, hydroxidization and oxidization of the cathode can be prevented. This will be explained more specifically below. A test was conducted in which with the first metal being lithium and the second metal being magnesium, the alloy cathode was formed varying the weight ratio of lithium to magnesium, yielding various organic EL elements having the above-described structure, and the organic EL elements were then kept for 200 hours under a dry atmosphere. When the lithium-to-magnesium weight ratio in the alloy cathode was altered to be 50:1000, 90:1000, 100:1000, 115:1000, and 300:1000, the elements having alloy cathodes with weight ratios of 90:1000, 100:1000, 115:1000, and 300:1000 were unable to maintain the light-emitting performance, while the element having an alloy cathode with a weight ratio of 50:1000 kept the light-emitting performance even for 600 hours. That is, it is preferable that 50 parts by weight of the first metal (lithium) be used to 1000 parts by weight of the second metal (magnesium).

Likewise, another test was conducted in which with the first metal being strontium and the second metal being magnesium, the alloy cathode was formed varying the weight ratio of strontium to magnesium, yielding various organic EL elements having the above-described structure, and the organic EL elements were then kept for 200 hours under a dry atmosphere. When the strontium-to-magnesium weight ratio in the alloy cathode was altered to be 400:1000, 500:1000, and then 600:1000, the elements having alloy cathodes with weight ratios of 500:1000 and 600:1000 were unable to maintain the light-emitting performance, while the element having an alloy cathode with a weight ratio of 400:1000 kept the light-emitting performance. That is, it is preferable that 400 or less parts by weight of the first metal (strontium) be used to 1000 parts by weight of the second metal (magnesium).

As Example 3 an organic EL element was produced with a double-layer structure, which has an electrode 1 having an Al-Li alloy region A, an anode transparent electrode 2 formed of an indium tin oxide (ITO), a thin organic fluorescent film 3 of an organic compound of tris(8-quinolinol)aluminum (Alq$_3$) and an organic hole-carrying layer 4 also of an organic compound of N,N'-diphenyl-N,N'-bis(3-methylphenyl)-1,1'-biphenyl-4,4'-diamine (TPD), laminated on a glass substrate 6, the film 3 and the layer 4 being arranged between the electrodes 1 and 2, and which does not have a protective electrode, as shown in FIG. 4. With regard to the Li concentration in the thin Al-Li cathode film of this EL element, the concentration of Li contained in the alloy region A where the thickness of the cathode film from the interface between the cathode film and the organic layer is above 0 Å to 1500 Å was controlled to a minute amount ranging from 0.005 wt. % to 0.3 wt. % inclusive. To keep the Li concentration within that of this alloy region, it is desirable that an Al-Li alloy matrix be previously prepared with a proper composition ratio and the alloy cathode film be formed by single-source, ohmic-resistance heating evaporation or an electron beam method, not by a co-evaporation.

According to Example 3, an increased stability in forming the EL element and an emission characteristic with high luminance and high luminous efficiency can be acquired by the strict control on the range of the Li concentration in the thin Al-Li cathode film. As the Li concentration is very low, the EL element provided will have excellent environmental stability and film formability.

Further, if the alloy cathode film is prepared by previously preparing an Al-Li alloy matrix with a proper composition ratio and using this matrix as an evaporated material, not by co-evaporation which simultaneously sputters Al and Li from separate evaporation sources, process control in the film formation will be easier advantageously, facilitating provision of stable elements and maintenance of the material and feed of the material to the evaporation boat. In addition, it is easy to give gradient to the Li concentration in the thickness direction in the alloy cathode film. For instance, it is possible to gradually increase or decrease the Li concentration toward the interface between the cathode film and the organic EL layer. This can permit continuous formation of the Al-Li cathode film and the protective electrode from one evaporation source.

Figure 1:
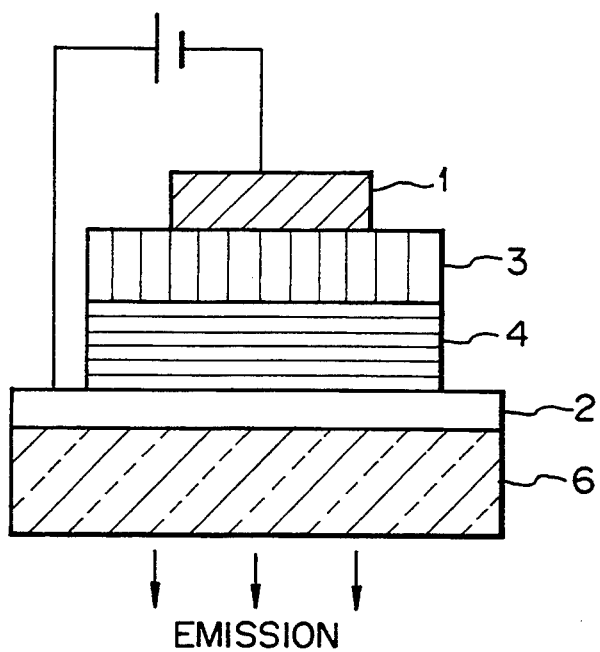
FIG. 1 is a diagram illustrating the structure of an organic EL element.

Specifically, an EL element with a double-layer structure without a protective electrode as shown in FIG. 1 was produced. The Al-Li alloy region electrode 1 (i.e., the electrode 1 consisting only of the Al-Li alloy region) of 1500 Å in thickness, the thin Alq$_3$ film 3 of 550 Å in thickness, and the TPD layer 4 of 700 Å in thickness were laminated.

Table below 3 shows the luminous efficiencies of this EL element with emission of 300 cd/m$^2$ at different Li concentrations of the Al-Li cathode of 0.024 wt. %, 0.58 wt. % and 5.6 wt. % and with the use of a pure Al cathode. Table 4 below shows the luminous efficiencies of this EL element with emission of 300 cd/m$^2$ at different Li concentrations of the alloy region of 0.024 wt. %, 0.48 wt. % and 0.65 wt. %.

Figure 5:
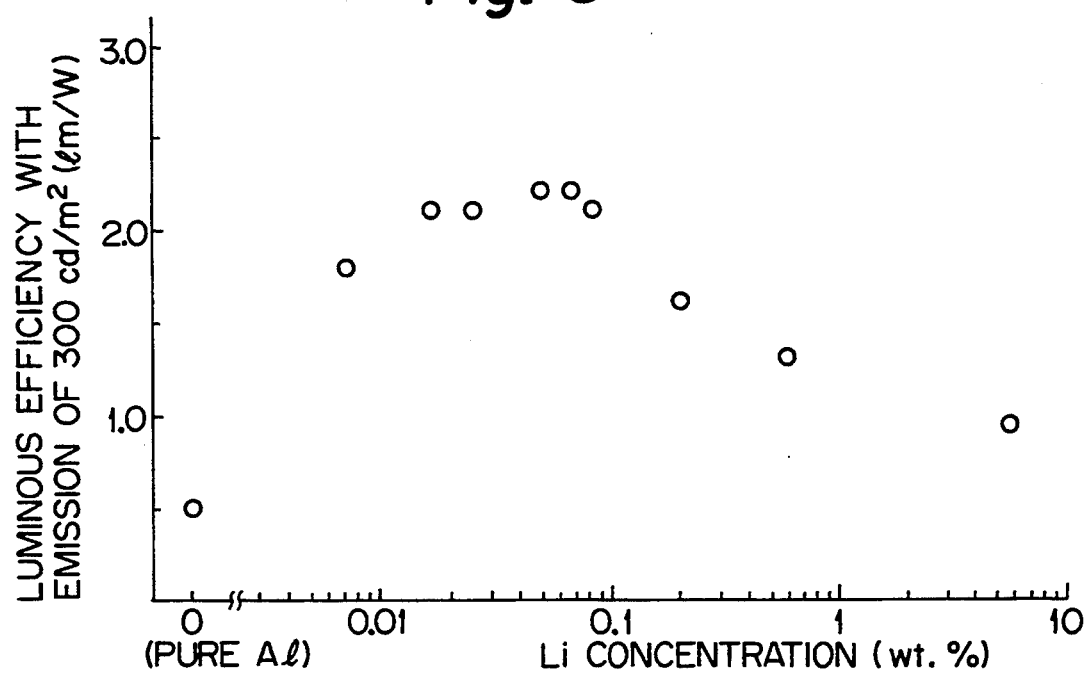
FIG. 5 is a graph showing the luminous efficiency with respect to the Li concentration of an alloy region of Example 3.

FIG. 5 presents a graph of the plotted luminous efficiencies with emission of 300 cd/m$^2$ at Li concentrations of the alloy region in this EL element of 0 wt. % (pure Al), 0.007 wt. %, 0.016 wt. %, 0.024 wt. %, 0.048 wt. %, 0.065 wt. %, 0.08 wt. %, 0.2 wt. %, 0.58 wt. % and 5.6 wt. %.

TABLE 3

| Li Concentration (wt. %) | Luminance Efficiency (lm/W) with Emission of 300 cd/m$^2$ |
|---|---|
| 0.024 | 2.1 |
| 0.58 | 1.3 |
| 5.6 | 0.92 |
| 0 (pure Al) | 0.50 |

TABLE 4

| Li Concentration (wt. %) | Luminance Efficiency (lm/W) with Emission of 300 cd/m$^2$ |
|---|---|
| 0.024 | 2.1 |
| 0.48 | 2.2 |
| 0.065 | 2.2 |

It is apparent from Tables 3 and 4 and FIG. 5 that high luminous efficiency equal to or above 1.5 (lm/W) with the luminance of 300 cd/m$^2$ is obtained when the Li concentration ranges from 0.005 to 0.3 wt. %, preferably from 0.01 wt. % to 0.1 wt. %, and the maximum luminous efficiency is obtained at 0.024 wt. %. As apparent from Table 4 and FIG. 5, a stable EL element with a very small variation in the characteristic of the EL element can be obtained if the cathode is formed within the mentioned ranges.

Figure 6:
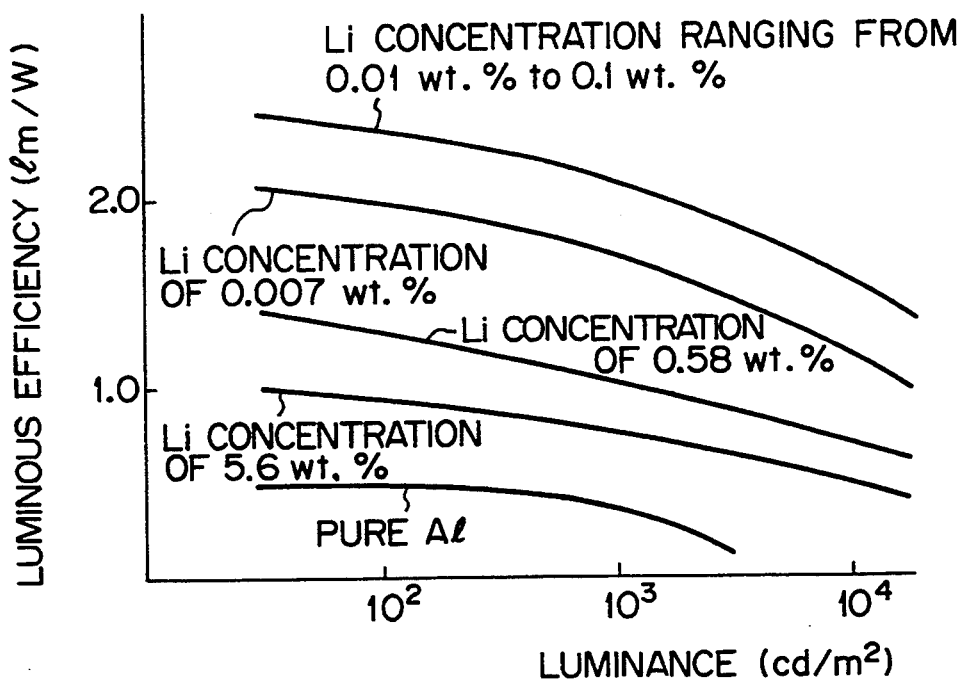
FIG. 6 is a graph showing the luminous efficiency vs. luminance characteristic of Example 3.

FIG. 6 presents a graph showing the luminous efficiencies (lm/W) of the EL element with respect to the luminance (cd/m$^2$) at different Li concentrations of the Al-Li cathode of 0.01 wt. % to 0.1 wt. %, at 0.007 wt. %, at 0.58 wt. % and at 5.6 wt. % and with the use of a pure Al cathode. It is apparent from the graph that those examples of the organic EL element have high luminous efficiency when the Li concentration of the alloy region of the cathode ranges from 0.005 to 0.3 wt. %.

Figure 7:
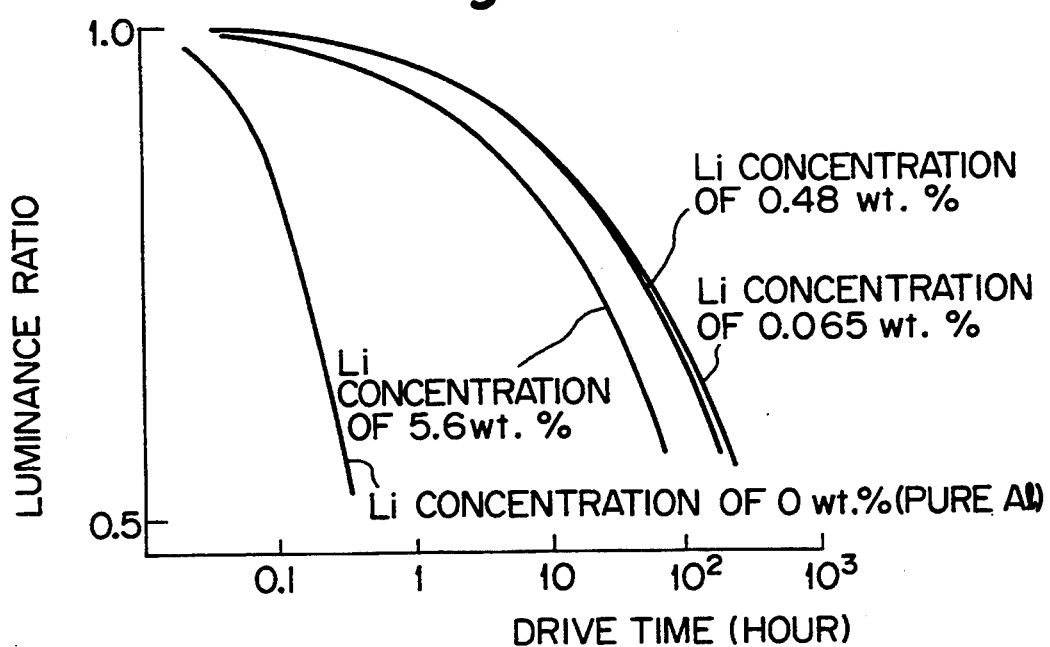
FIG. 7 is a graph showing a change in the luminance of the EL element of Example 3 with time.

FIG. 7 presents a graph showing the degradation ratio of the luminance with time (luminance ratio) of the EL element at different Li concentrations of the Al-Li cathode of 0.065 wt. %, 0.48 wt. % and 5.6 wt. % and with the use of a pure Al cathode. As is apparent from the graph, those examples of the organic EL element has lower luminance degradation with time, thus ensuring longer service life, when the Li concentration of the alloy region of the cathode ranges from 0.005 to 0.3 wt. %, preferably from 0.01 wt. % to 0.1 wt. %.

As Example 4 an organic EL element was produced with a double-layer structure without a protective electrode, which, like the organic EL element shown in FIG. 4 whose cathode has the alloy region A, comprises an electrode 1 having a Mg-Sr alloy region A instead of the Al-Li alloy region, an anode transparent electrode 2 formed of ITO, a thin organic fluorescent film 3 of Alq$_3$ and an organic hole-carrying layer 4 of TPD, the film 3 and the layer 4 being arranged between the electrodes 1 and 2. With regard to the Sr concentration in the thin Mg-Sr cathode film of this EL element, the concentration of Sr contained in the alloy region A where the thickness of the cathode film from the interface between the cathode film and the organic layer is above 0 Å to 1500 Å was controlled to an amount ranging from 10 wt. % to 40 wt. %. To keep the Sr concentration within that of this alloy region, it is desirable that a Mg-Sr alloy matrix be previously prepared with a proper composition ratio and the alloy cathode film be formed by single-source, ohmic-resistance heating evaporation or an electron beam method, not by a co-evaporation.

According to Example 4, an increased stability in forming the EL element and a good emission characteristic with high luminance and high luminous efficiency can be acquired by the strict control on the range of the Sr concentration in the thin Mg-Sr cathode film. The EL element provided will also have excellent environmental stability and film formability.

Further, if the alloy cathode film is prepared by previously preparing a Mg-Sr alloy matrix with a proper composition ratio and using this matrix as an evaporated material, not by co-evaporation which simultaneously sputters Mg and Sr from separate evaporation sources, process control in the film formation will be easier advantageously, facilitating provision of stable elements and maintenance of the material and feed of the material to the evaporation boat.

In addition, it is easy to give gradient to the Sr concentration in the thickness direction in the alloy cathode film. For instance, it is possible to gradually increase or decrease the Sr concentration toward the interface between the cathode film and the organic EL layer. This can permit continuous formation of the Mg-Sr cathode film and the protective electrode from one evaporation source.

Specifically, an EL element with a double-layer structure without a protective electrode as shown in FIG. 1 was produced. The Mg-Sr alloy region electrode 1 (i.e., the electrode 1 consisting only of the Mg-Sr alloy region) of 1500 Å in thickness, the thin Alq$_3$ film 3 of 550 Å in thickness, and the TPD layer 4 of 700 Å in thickness were laminated. Table below 5 shows the luminous efficiencies of this EL element with emission of 300 cd/m$^2$ at different Sr concentrations of the Mg-Sr cathode of 20.5 wt. % and 35.6 wt. %. Table 6 below shows the luminous efficiencies of this EL element with emission of 300 cd/m$^2$ at different Sr concentrations of the alloy region of 9.37 wt. %, 20.5 wt. % and 26.8 wt. %.

Figure 8:
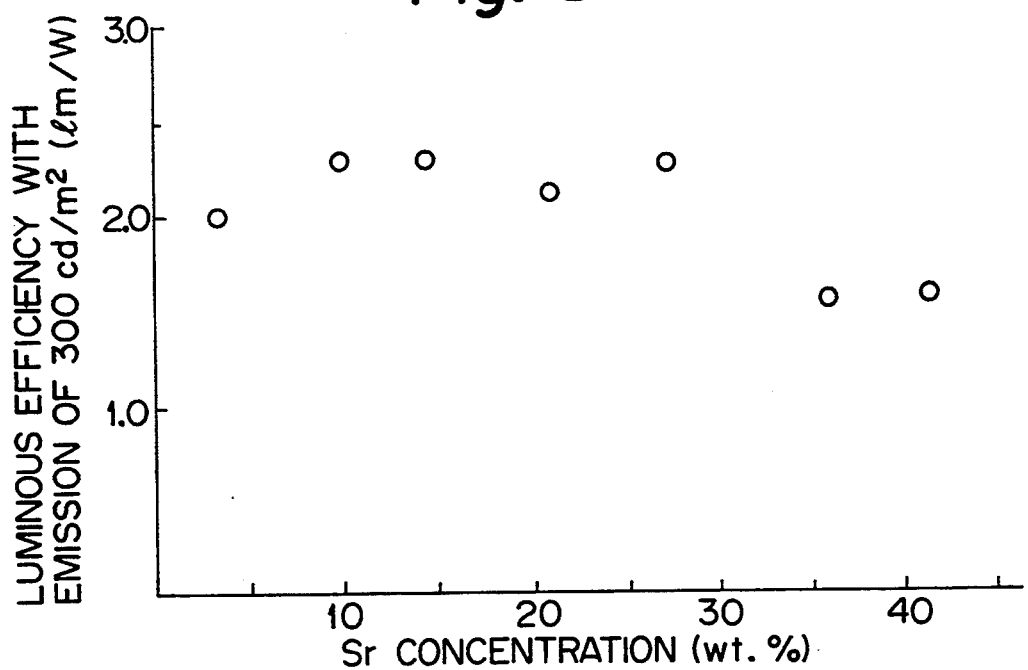
FIG. 8 is a graph showing the luminous efficiency with respect to the Sr concentration of an alloy region of Example 4.

FIG. 8 presents a graph of the plotted luminous efficiencies with emission of 300 cd/m$^2$ at Sr concentrations of the alloy region in this EL element of 3.0 wt. %, 9.37 wt. %, 14.0 wt. %, 20.5 wt. %, 26.8 wt. %, 35.6 wt. % 41.0 wt. %.

TABLE 5

| Sr Concentration (wt. %) | Luminance Efficiency (lm/W) with Emission of 300 cd/m$^2$ |
| --- | --- |
| 20.5 | 2.13 |
| 35.6 | 1.57 |

TABLE 6

| Sr Concentration (wt. %) | Luminance Efficiency (lm/W) with Emission of 300 cd/m$^2$ |
| --- | --- |
| 9.37 | 2.30 |
| 20.5 | 2.13 |
| 26.8 | 2.28 |

It is apparent from Tables 5 and 6 and FIG. 8 that high luminous efficiency equal to or above 1.5 (lm/W) with the luminance of 300 cd/m$^2$ is obtained when the Sr concentration in the Mg-Sr cathode film ranges from 10 to 40 wt. %, preferably from 10 wt. % to 25 wt. %. Within this range, an EL element with a stable characteristic having the maximum luminous efficiency and a very small characteristic variation can be obtained.

Figure 9:
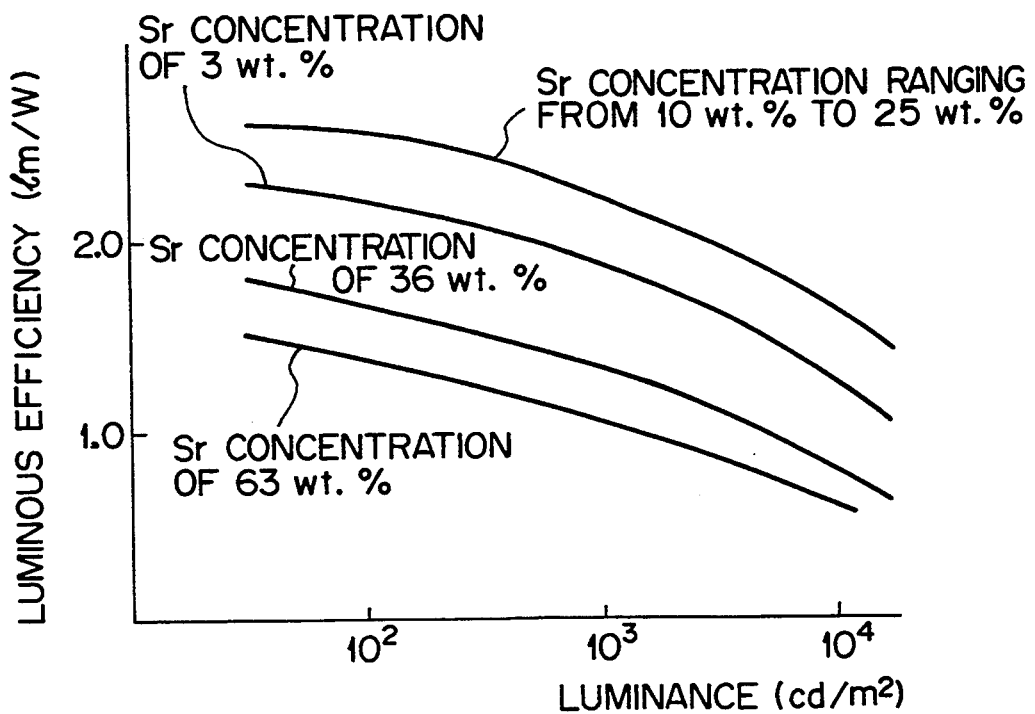
FIG. 9 is a graph showing the luminous efficiency vs. luminance characteristic of Example 4.

FIG. 9 presents a graph showing the luminous efficiencies (lm/W) of the EL element with respect to the luminance (cd/m$^2$) at different Sr concentrations of the Mg-Sr cathode of 10 wt. % to 25 wt. %, at 3 wt. %, at 36 wt. % and at 63 wt. %. It is apparent from the graph that those examples of the organic EL element have high luminous efficiency when the Sr concentration of the alloy region of the cathode ranges from 10 to 25 wt. %.

Figure 10:
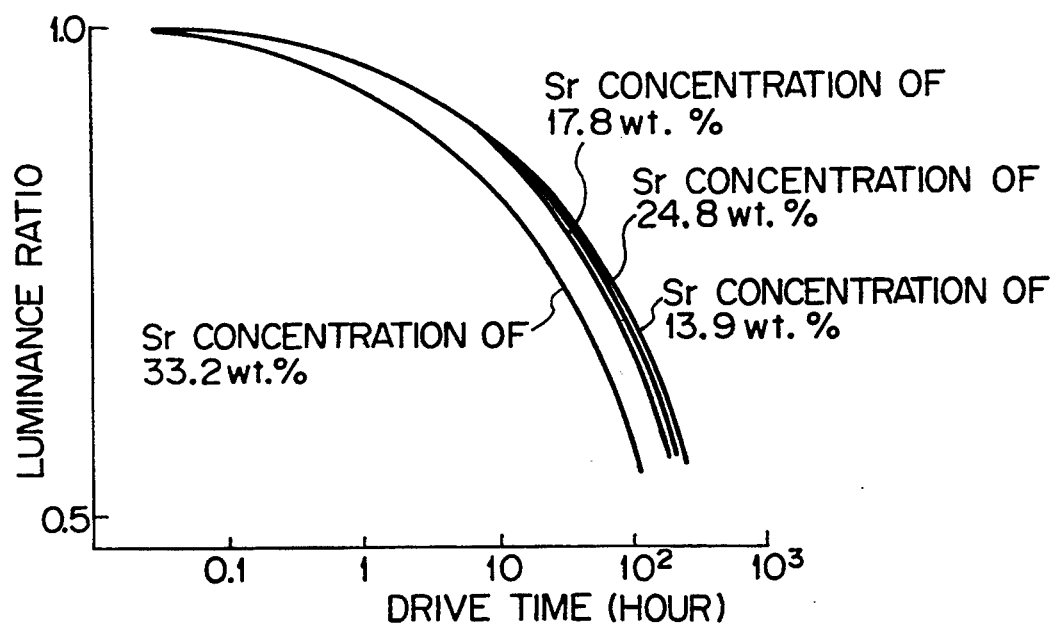
FIG. 10 is a graph showing a change in the luminance of the EL element of Example 3 with time.

FIG. 10 presents a graph showing the degradation ratio of the luminance with time (luminance ratio) of the EL element at different Sr concentrations of the Mg-Sr cathode of 13.9 wt. %, 17.8 wt. %, 24.8 wt. % and 33.2 wt. %. As is apparent from the graph, those examples of the organic EL element has lower luminance degradation with time, thus ensuring longer service life, when the Sr concentration of the alloy region of the cathode ranges from 10 to 40 wt. %, preferably from 10 wt. % to 25 wt. %.

When the Sr concentration is 40 wt. % or higher, the luminous efficiency decreases with the increase in the Sr concentration, rapidly deteriorating the environmental stability. With the Sr concentration is equal to or below 10 wt. %, it will be difficult to improve the poor film formability of Mg so that a stable EL element cannot be provided.

Figure 11:
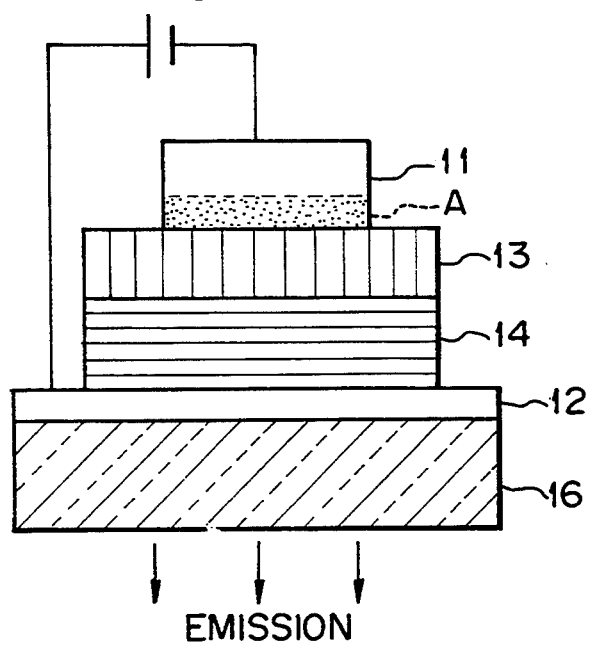
FIG. 11 is a structural diagram illustrating an organic EL element according to one embodiment of the present invention.

As shown in FIG. 11, an organic EL element of this Example according to the present invention comprises an electrode 11 having an In-Li alloy region A, an anode transparent electrode 12 formed of an indium tin oxide (ITO), a thin organic fluorescent film 13 formed of, for example, tris(8-quinolinol)aluminum (Alq$_3$) and an organic hole-carrying layer 14 formed of, for example N,N'-diphenyl-N,N'-bis(3 methylphenyl)-1,1'-biphenyl-4,4'-diamine (TPD), laminated on a glass substrate 16, the film 13 and the layer 14 being arranged between the electrodes 11 and 12. In particular, the In-Li alloy region A of the cathode 1 is formed to contact the interface between the light-emitting layer 13 and the cathode 11. The EL element of this Example thus uses an In-Li alloy as a material for the cathode alloy region.

With regard to the Li concentration in the In-Li alloy region of the cathode 1, the concentration of Li contained in the alloy region A where the thickness of the cathode film from the interface between the cathode film and the organic layer is above 0 Å to 10000 Å was controlled to a very minute amount ranging from 0.01 wt. % to 0.1 wt. %. To keep the Li concentration within that of this alloy region A, it is desirable that an Al-Li alloy matrix be previously prepared with a proper composition ratio and the alloy cathode film is formed by single-source, ohmic-resistance heating evaporation or an electron beam method, not by a co-evaporation.

This Example provides advantages, such as a good emission characteristic with high luminance and high luminous efficiency, particularly, high environmental stability and film formability, which significantly suppress the occurrence and growth of black spots, an increased stability in forming an EL element (which means the provision of a stable EL element without variation), and a reduced attenuation ratio of luminance in a continuous emission test.

Further, if the alloy cathode film is prepared by previously preparing an In-Li alloy matrix with a proper composition ratio and using this matrix as an evaporated material, not by co-evaporation which simultaneously sputters In and Li from separate evaporation sources, process control in the film formation will be easier, facilitating provision of stable EL elements and maintenance of the material and feed of the material to the evaporation boat. In addition, it is easy to give gradient to the Li concentration in the In-Li cathode film in the thickness direction thereof. For instance, it is possible to gradually increase or decrease the Li concentration toward the interface between the cathode film and the organic EL layer. This can permit continuous formation of the In-Li cathode film and the protective electrode from one evaporation source.

Specifically, an EL element with a double-layer structure as shown in FIG. 1 was produced. The In-Li alloy region electrode 1 (i.e., the cathode 1 consisting only of the In-Li alloy region) of 9000 Å in thickness, the thin Alq3 film 3 of 550 Å in thickness, and the TPD layer 4 of 700 Å in thickness were laminated. Table below 7 shows the luminous efficiencies of this EL element with emission of 300 cd/m$^2$ at different Li concentrations of the In-Li cathode film of 0.025 wt. %, 0.032 wt. %, 0.067 wt. % and 0.12 wt. % and with the use of a pure In cathode.

Figure 12:
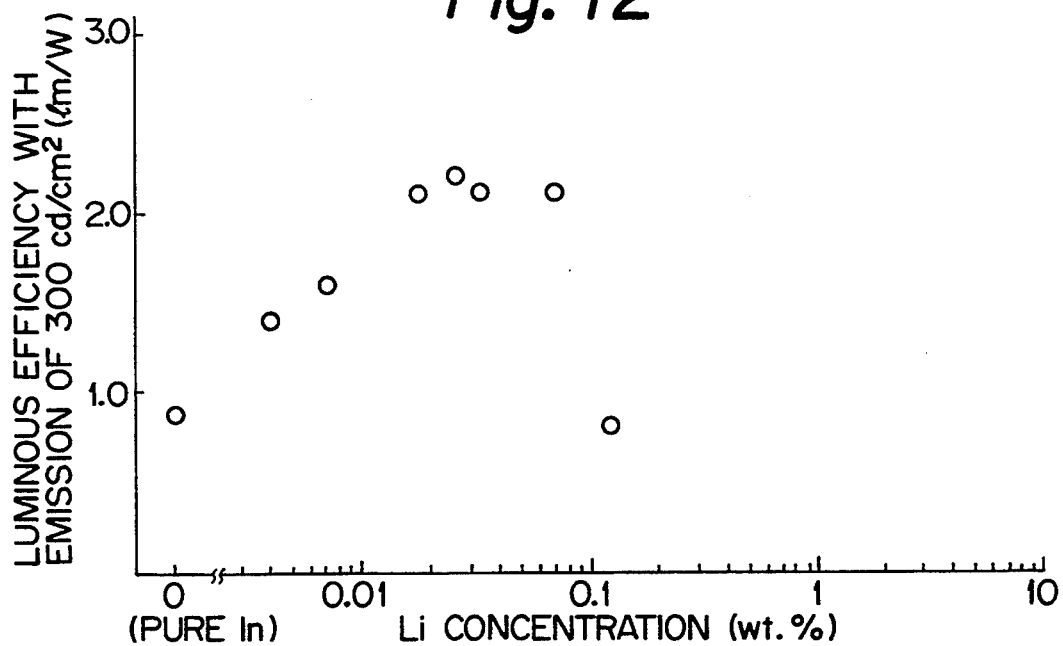
FIG. 12 presents a graph showing the luminous efficiency with respect to the Li concentration of an alloy region of this embodiment.

FIG. 12 presents a graph of the plotted luminous efficiencies with emission of 300 cd/m$^2$ at Li concentrations of the alloy region in this EL element of 0 wt. % (pure In), 0.004 wt. %, 0.008 wt. %, 0.017 wt. %, 0.025 wt. %, 0.032 wt. %, 0.067 wt. %, and 0.12 wt. %.

TABLE 7

| Li Concentration (wt. %) | Luminance Efficiency (lm/W) with Emission of 300 cd/m$^2$ |
| --- | --- |
| 0.025 | 2.2 |
| 0.032 | 2.1 |
| 0.067 | 2.1 |
| 0.12 | 0.79 |
| 0 (pure In) | 0.86 |

It is apparent from Table 7 and FIG. 12 that high luminous efficiency equal to or above 1.5 (lm/W) with the luminance of 300 cd/m$^2$ is obtained when the Li concentration ranges from 0.005 to 0.11 wt. %, preferably from 0.01 wt. % to 0.1 wt. %, in which the maximum luminous efficiency is obtained. Within this range, a stable EL element with a very small variation in the characteristic of the EL element can be obtained.

Figure 13:
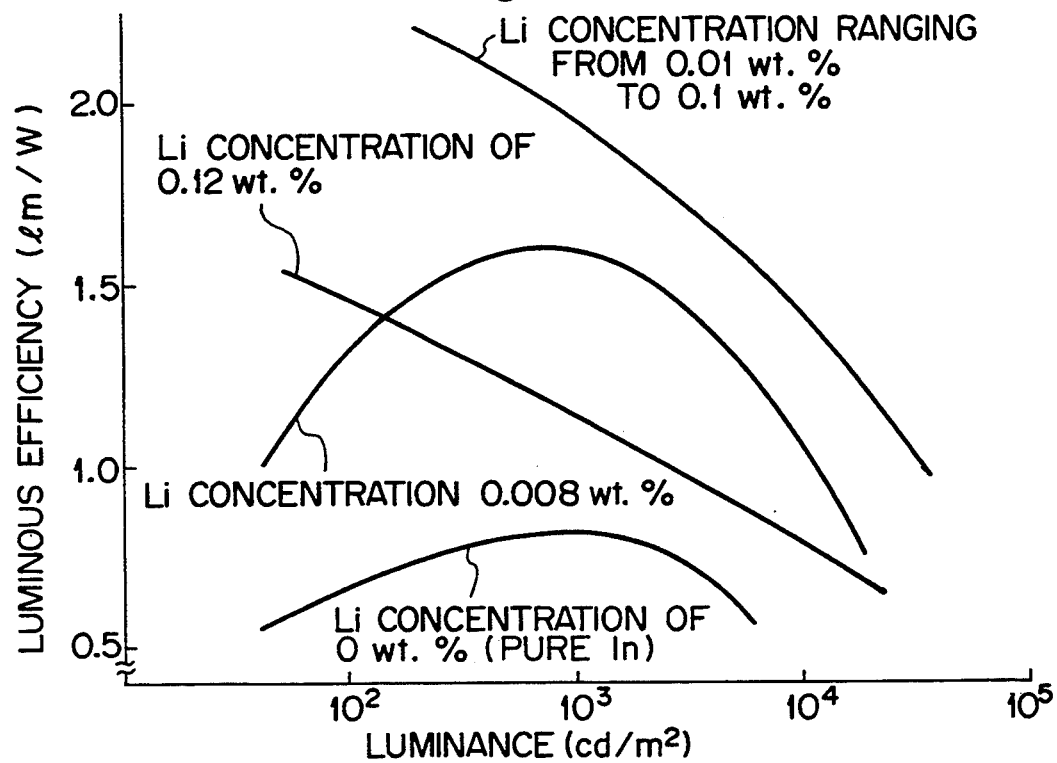
FIG. 13 is a graph showing the luminous efficiency vs. luminance characteristic of this embodiment.

FIG. 13 presents a graph showing the luminous efficiencies (lm/W) of the EL element with respect to the luminance (cd/m$^2$) at different Li concentrations of the In-Li cathode of 0.01 to 0.1 wt. %, at 0.008 wt. % and at 0.12 wt. % and with the use of a pure In cathode. It is apparent from the graph that those examples of the organic EL element have high luminous efficiency when the Li concentration of the alloy region of the cathode ranges from 0.001 to 0.1 wt. %.

Figure 14:
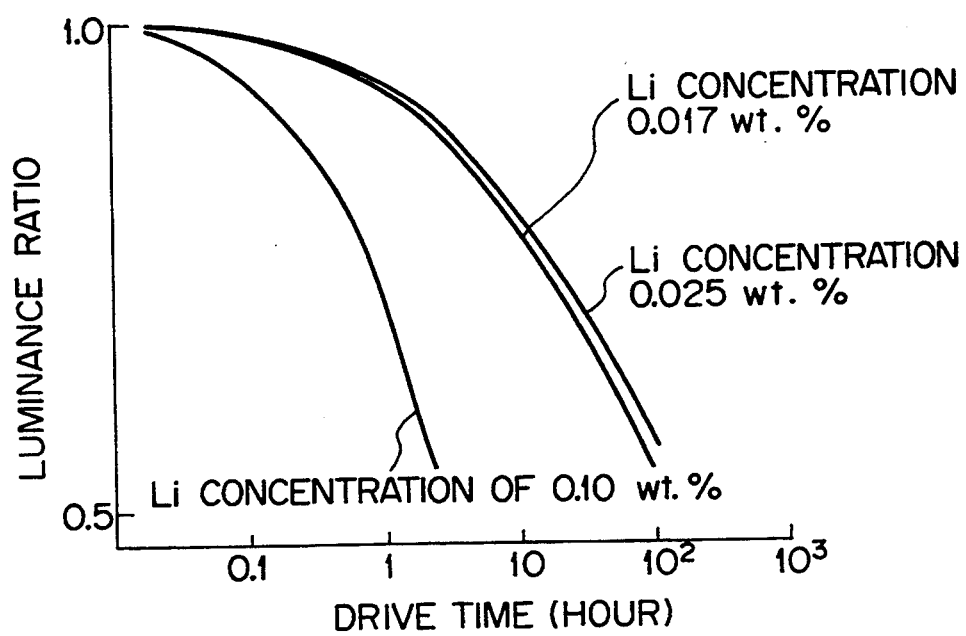
FIG. 14 is a graph showing a change in the luminance of the EL element of this embodiment with time.

FIG. 14 presents a graph, which is the results of checking the luminance attenuation ratio in a continuous emission test on this organic EL element and shows the degradation ratio of the luminance with time (luminance ratio) of the EL element at different Li concentrations of the In-Li cathode of 0.017 wt. %, 0.025 wt. % and 0.10 wt. %. As is apparent from the graph, those examples of the organic EL element has less luminance degradation with time, thus ensuring longer service life, when the Li concentration of the alloy region of the cathode ranges from 0.01 to 0.1 wt. %.

FIGS. 15 and 16 illustrate the results of checking the environmental stability and film formability of the organic EL element of this Example in an emission area observing test.

Figure 15A:
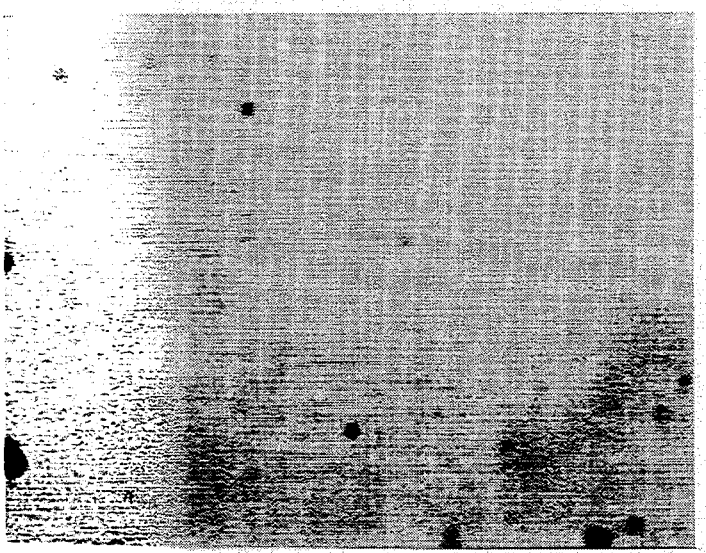
FIGS. 15A and 15B are enlarged plan photographs showing light-emitting portions (within dots) immediately after the fabrication of the EL element of this embodiment (FIG. 15A) and 700 hours after the fabrication (FIG. 15B)
Figure 15B:
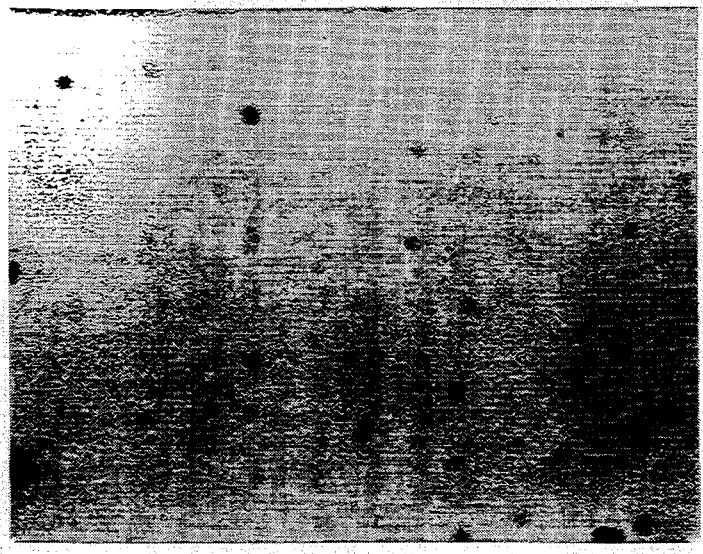
Figure 16A:
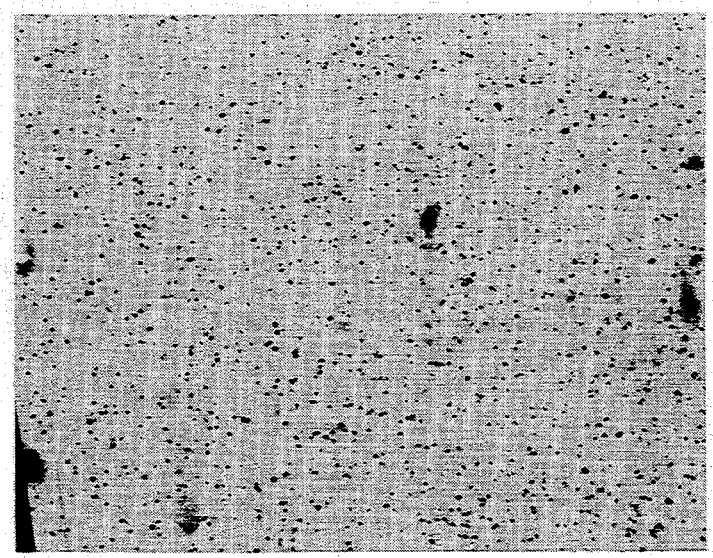
FIGS. 16A and 16B are enlarged plan photographs showing light-emitting portions (within dots) immediately after the fabrication of the EL element of the comparative example (FIG. 16A) and 600 hours after the fabrication (FIG. 16B)
Figure 16B:
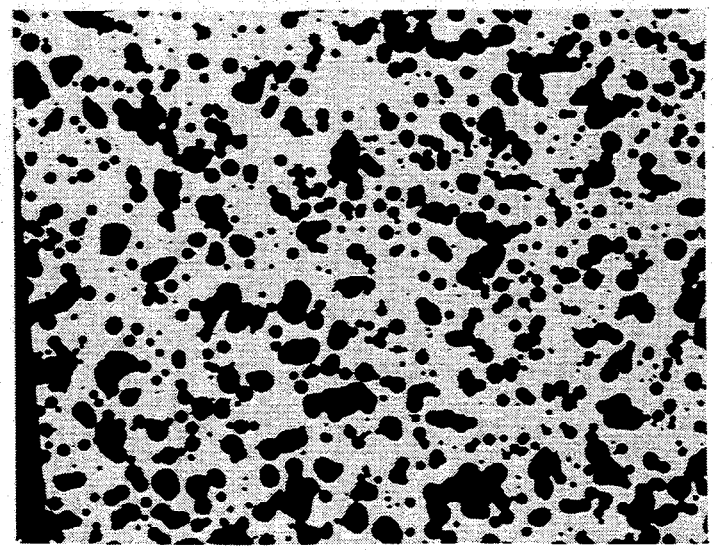

FIG. 15A presents an enlarged photograph showing light-emitting portions (within dots) immediately after the fabrication of the EL element of this Example, and FIG. 15B an enlarged photograph showing light-emitting portions (within dots) 700 hours after the fabrication. FIGS. 16A and 16B present enlarged photographs showing light-emitting portions (within dots) immediately after the fabrication of the EL element consisting of Mg-Al alloy cathode of the comparative example (FIG. 16A) and 600 hours after the fabrication (FIG. 16B). Those EL elements were observed and photographed while being held in a vacuum desiccator.

It is apparent from FIGS. 15 and 16, the black spots of the element employing Mg-Al as a material for the cathode were growing larger with the passage of time, while this Example using In-Li as the cathode material showed no occurrence of black spots.

Figure 17:
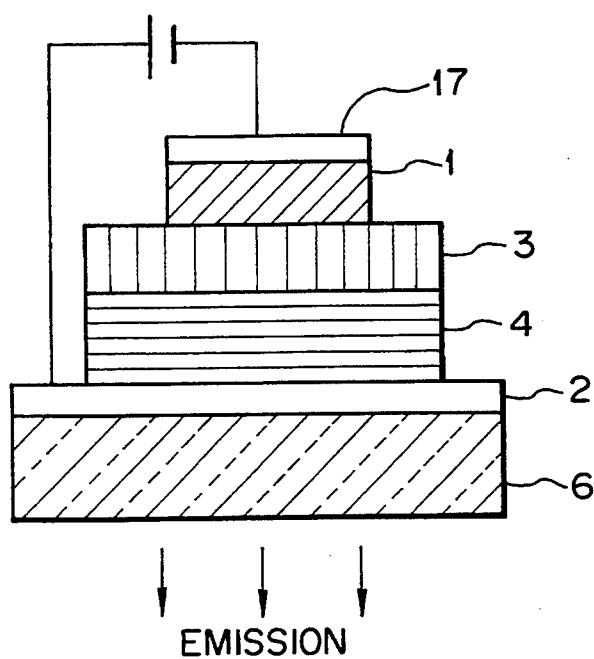
FIG. 17 is a structural diagram showing an organic EL element according to another embodiment of the present invention.

It is also preferable to laminate the protective electrode 17 on the cathode 1 as in another example shown in FIG. 17. The protective electrode 17 is preferably formed of aluminum or magnesium. The presence of the protective electrode 17 can reduce the sheet resistance of the whole cathode and protective electrode as well as can stabilize the cathode 1.

To preserve an organic EL element during fabrication, it is preferable to seal in an inactive gas such as argon or nitrogen while making the surrounding of the element airtight, or make the sealing while putting diphosphorus pentaoxide in the vicinity of the element, isolated therefrom, when air is to be sealed in therewith.

Although the foregoing description of the examples of the present invention has been given of organic EL elements with a double-layer structure, the present invention is not limited to this particular structure. This invention may be applied to a three-layer structure which has, besides the thin organic fluorescent film and the organic hole-carrying layer, an organic electron-carrying layer as another organic layer therebetween in order to facilitate injection of electrons from the alloy cathode.

As described above, according to the present invention, in an organic EL element comprising a transparent anode, a hole-carrying layer, a light-emitting layer and an alloy cathode consisting of a first metal Li and a stabilizing second metal Al, all laminated on a substrate, the concentration of the first metal Li contained in the alloy region with a predetermined thickness (ranging from above 0 Å to 1500 Å) from the interface between the alloy cathode and the organic layer (light-emitting layer or electron-carrying layer) is controlled to a minute amount ranging from 0.005 wt. % to 0.3 wt. %, so that the organic EL element provided will have high luminous efficiency of 1.5 (lm/W) or above at luminance of 300 cd/m$^2$ and high luminance in addition to high environmental stability that can suppress a variation caused in the fabrication of the element. Further, according to the present invention, in an organic EL element comprising a transparent anode, a hole-carrying layer, a light-emitting layer and an alloy cathode consisting of a first metal Sr and a stabilizing second metal Mg, all laminated on a substrate, the concentration of the first metal Sr contained in the alloy region with a predetermined thickness (ranging from above 0 Å to 1500 Å) from the interface between the alloy cathode and the organic layer (light-emitting layer or electron-carrying layer) is controlled to a minute amount ranging from 10 wt. % to 40 wt. %, so that the organic EL provided element will have high environmental stability as well as high luminous efficiency and high luminance.

Furthermore, in an organic EL element embodying the present invention, which comprises a transparent anode, a hole-carrying layer, a light-emitting layer and an alloy cathode consisting of a first metal and a second metal, all laminated on a substrate, a protective electrode is formed on the alloy cathode so that the luminance with a low drive voltage can be increased, and the complete covering of the alloy cathode can improve the environmental stability.

Furthermore, according to the present invention, in an organic EL element comprising an anode, an organic hole-carrying layer, an organic light-emitting layer and a cathode consisting of indium and lithium and having an alloy region that contacts the interface between the cathode and the light-emitting layer, all laminated in order on a substrate, the concentration of Li contained in the alloy region with a predetermined thickness (ranging from above 0 Å to 10000 Å) from the interface between the cathode and the organic layer (light-emitting layer or electron-carrying layer) is controlled to a minute amount ranging from 0.005 wt. % to 0.11 wt. %, so that the organic EL element provided will have high environmental stability as well as high luminous efficiency and high luminance.

What is claimed is:

1. An organic EL element comprising an anode, a hole-carrying layer formed of an organic compound, a light-emitting layer formed of an organic compound and a cathode, laminated in order on a substrate,
    said cathode being made of lithium and aluminum and having an alloy region contacting an interface between said light-emitting layer and said cathode,
    said alloy region containing said lithium with a concentration in a weight ratio of 0.005 to 0.3 parts by weight to 100 parts by weight of said aluminum.

2. The organic EL element according to claim 1, wherein said alloy region lies within a thickness range from above 0 Å to 1500 Å from said interface between said light-emitting layer and said alloy cathode.

3. The organic EL element according to claim 1, further comprising a protective electrode laminated on said alloy cathode.

4. An organic EL element comprising an anode, a hole-carrying layer formed of an organic compound, a light-emitting layer formed of an organic compound and a cathode, laminated in order on a substrate,
    said cathode being made of strontium and magnesium and having an alloy region contacting an interface between said light-emitting layer and said cathode,
    said alloy region containing said strontium with a concentration in a weight ratio of 10 to 40 parts by weight to 100 parts by weight of said magnesium.

5. The organic EL element according to claim 4, wherein said alloy region lies within a thickness range from above 0 Å to 1500 Å from said interface between said light-emitting layer and said alloy cathode.

6. The organic EL element according to claim 1, further comprising a protective electrode laminated on said alloy cathode.

7. An organic EL element comprising an anode, a hole-carrying layer formed of an organic compound, a light-emitting layer of an organic compound and an alloy cathode, laminated in order on a substrate,
    said alloy cathode comprising lithium and a second metal capable of stabilizing said lithium,
    further comprising a protective electrode laminated on said alloy cathode.

8. The organic EL element according to claim 7, wherein a weight ratio of said lithium to said second metal of said alloy cathode is 50 parts by weight to 1000 parts by weight.

9. The organic EL element according to claim 7, wherein said second metal is selected from the group consisting of aluminum and magnesium.

10. The organic EL element according to claim 7, wherein said protective electrode comprises said second metal.

11. An organic EL element comprising an anode, an organic hole-carrying layer formed of an organic compound, a light-emitting layer formed of an organic compound and a cathode, laminated in order on a substrate,
    said cathode being made of indium and lithium and having an alloy region contacting an interface between said light-emitting layer and said cathode, said alloy region containing said lithium with a concentration in a weight ratio of 0.005 to 0.11 part by weight to 100 parts by weight of said indium.

12. The organic EL element according to claim 11, wherein said alloy region lies within a thickness range from above 0 Å to 10000 Å from said interface between said light-emitting layer and said cathode.

13. An organic EL element comprising an anode, a hole-carrying layer formed of an organic compound, a light-emitting layer formed of an organic compound, an organic electron-carrying layer and a cathode, laminated in order on a substrate,
    said cathode being made of lithium and aluminum and having an alloy region contacting an interface between said organic electron-carrying layer and said cathode,
    said alloy region containing said lithium with a concentration in a weight ratio of 0.005 to 0.3 parts by weight to 100 parts by weight of said aluminum.

14. The organic EL element according to claim 13, wherein said alloy region is present within a thickness range from above 0 Å to 1500 Å from said interface between said organic electron-carrying layer and said cathode.

15. The organic EL element according to claim 13, further comprising a protective electrode laminated on said cathode.

16. An organic EL element comprising an anode, a hole-carrying layer formed of an organic compound, a light-emitting layer formed of an organic compound, an organic electron-carrying layer and a cathode, laminated in order on a substrate,
- said cathode being made of strontium and magnesium and having an alloy region contacting an interface between said organic electron-carrying layer and said cathode,
- said alloy region containing said strontium with a concentration in a weight ratio of 10 to 40 parts by weight to 100 parts by weight of said magnesium.

17. The organic EL element according to claim 16, wherein said alloy region is present within a thickness range from above 0 Å to 1500 Å from said interface between said organic electron-carrying layer and said cathode.

18. The organic EL element according to claim 16, further comprising a protective electrode laminated on said cathode.

19. An organic EL element comprising an anode, a hole-carrying layer formed of an organic compound, a light-emitting layer of an organic compound, an organic electron-carrying layer and an alloy cathode, laminated in order on a substrate,
- said alloy cathode comprising lithium and a second metal capable of stabilizing said lithium, further comprising a protective electrode laminated on said alloy cathode.

20. The organic EL element according to claim 19, wherein a weight ratio of said lithium to said second metal of said alloy cathode is 50 parts by weight to 1000 parts by weight.

21. The organic EL element according to claim 19, wherein said second metal is selected from the group consisting of aluminum and magnesium.

22. The organic EL element according to claim 19, wherein said protective electrode comprises said second metal.

23. An organic EL element comprising an anode, an organic hole-carrying layer formed of an organic compound, a light-emitting layer formed of an organic compound, an organic electron-carrying layer and cathode, laminated in order on a substrate,
- said cathode being made of indium and lithium and having an alloy region contacting an interface between said organic electron-carrying layer and said cathode,
- said alloy region containing said lithium with a concentration in a weight ratio of 0.005 to 0.11 part by weight to 100 parts by weight of said indium.

24. The organic EL element according to claim 23, wherein said alloy region is present within a thickness range from above 0 Å to 10000 Å from said interface between said organic electron-carrying layer and said cathode.

* * * * *